(12) United States Patent
Shin

(10) Patent No.: US 12,219,717 B2
(45) Date of Patent: Feb. 4, 2025

(54) TRANSCEIVER ANTENNA FOR WIRELESS CHARGING, APPARATUS AND METHOD OF MANUFACTURING THE SAME

(71) Applicant: Passcon Co., Ltd., Bucheon-si (KR)

(72) Inventor: Hyejoong Shin, Daejeon (KR)

(73) Assignee: Passcon Co., LTD., Bucheon-si (KR)

( * ) Notice: Subject to any disclaimer, the term of this patent is extended or adjusted under 35 U.S.C. 154(b) by 169 days.

(21) Appl. No.: 17/272,829

(22) PCT Filed: Jun. 15, 2020

(86) PCT No.: PCT/KR2020/007735
§ 371 (c)(1),
(2) Date: Mar. 2, 2021

(87) PCT Pub. No.: WO2020/251334
PCT Pub. Date: Dec. 17, 2020

(65) Prior Publication Data
US 2022/0352633 A1    Nov. 3, 2022

(30) Foreign Application Priority Data

Jun. 13, 2019  (KR) .................. 10-2019-0069837

(51) Int. Cl.
*H05K 3/32*    (2006.01)
*H05K 1/02*    (2006.01)

(52) U.S. Cl.
CPC ........... *H05K 3/328* (2013.01); *H05K 1/0243* (2013.01); *H05K 2201/10098* (2013.01)

(58) Field of Classification Search
CPC ............ H05K 3/328; H05K 1/0243; H05K 2201/10098; H04B 5/00; H01F 41/041;
(Continued)

(56) References Cited

U.S. PATENT DOCUMENTS 6,412,702 B1 *  7/2002  Ishikawa ............... G06K 19/072
                                                                235/487
8,322,624 B2 * 12/2012  Finn ........................ H04B 5/0062
                                                                235/492
(Continued)

FOREIGN PATENT DOCUMENTS

JP          2002230500      *  8/2002
JP          2007174049      *  7/2007
(Continued)

OTHER PUBLICATIONS

International Search Report mailed on Sep. 28, 2020, issued in connection with International Application No. PCT/KR2020/007735, filed on Jun. 15, 2020, 4 pages.
(Continued)

*Primary Examiner* — Richard Tan
(74) *Attorney, Agent, or Firm* — McDonnell Boehnen Hulbert & Berghoff LLP

(57) ABSTRACT

According to one embodiment of the present disclosure, an antenna device, an apparatus for manufacturing the same, and a method for manufacturing the same are disclosed. The antenna device according to one embodiment of the present disclosure comprises an antenna substrate sheet and an antenna pattern. A connecting PCB is attached on the antenna substrate sheet. The antenna pattern starts from one of a plurality of connecting terminals of the connecting PCB and ends at another one of the plurality of connecting terminals. The antenna pattern comprises a plurality of wires which functions as one line and a bridge. The plurality of wires is embedded on the antenna substrate sheet. The bridge connects the connecting PCB and a point where winding of the plurality of wires on the antenna substrate sheet is completed.

10 Claims, 13 Drawing Sheets

(58) Field of Classification Search
CPC .... H01F 27/2804; H01F 27/292; H01F 38/14;
H01F 41/076; H01F 41/09; H02J 50/005;
H02J 50/10; H02J 50/20; H01Q 1/38;
H01Q 1/24
USPC .......................................................... 307/104
See application file for complete search history.

(56) References Cited

U.S. PATENT DOCUMENTS

| | | | |
|---|---|---|---|
| 2012/0032858 A1 | 2/2012 | Chang et al. | |
| 2012/0274148 A1* | 11/2012 | Sung ........................ | H02J 50/10 307/104 |
| 2019/0123443 A1 | 4/2019 | Russell et al. | |
| 2020/0090858 A1* | 3/2020 | Hong ..................... | H01F 27/323 |
| 2020/0295448 A1 | 9/2020 | Shin | |

FOREIGN PATENT DOCUMENTS

| | | |
|---|---|---|
| KR | 10-2002-0087320 A | 11/2002 |
| KR | 10-2012-0013838 A | 2/2012 |
| KR | 10-2015-0099478 A | 8/2015 |
| KR | 10-2017-0011430 A | 2/2017 |
| KR | 10-2019-0061575 A | 6/2019 |

OTHER PUBLICATIONS

Written Opinion mailed on Sep. 28, 2020, issued in connection with International Application No. PCT/KR2020/007735, filed on Jun. 15, 2020, 3 pages.

Notification of Grant of Patent mailed Apr. 13, 2020, issued in connection with Korean Application No. 10-2019-0069837, filed on Jun. 13, 2019, 2 pages.

* cited by examiner

TRANSCEIVER ANTENNA FOR WIRELESS CHARGING, APPARATUS AND METHOD OF MANUFACTURING THE SAME

CROSS-REFERENCE TO RELATED APPLICATIONS

The present application is a U.S. National Phase Application under 35 U.S.C. § 371 of International Application No. PCT/KR2020/007735 filed Jun. 15, 2020, which claims priority to Korean Patent Application No. 10-2019-0069837 filed Jun. 13, 2019, the disclosures of each of which are incorporated herein by reference in their entirety.

TECHNICAL FIELD

The present disclosure relates to a transceiver antenna for wireless charging, an apparatus and a method of manufacturing the transceiver antenna, and more particularly, to an antenna device including an antenna substrate sheet to which a connecting PCB (Printed Circuit Board) and an antenna pattern which starts from one of a plurality of connecting terminals of the connecting PCB and ends at another one of the plurality of connecting terminals. The antenna pattern includes a plurality of wires playing the role of one line embedded in the antenna substrate sheet, and a bridge which connects a point where winding of the plurality of wires is completed on the antenna substrate sheet and the connecting PCB.

BACKGROUND ART

Generally, wireless charge technology for charging electronic equipment is being developed in accordance with the evolution of wireless charge technology in modern electronic equipment. Various antennas are developed and used for improving efficiency of communication between a transmission module (Tx, Transmitter) and a reception module (Rx, Receiver). Particularly, due to the development of wireless devices, demand for short range wireless communication antennas is rapidly increasing. Methods of forming short range wireless communication antennas and antennas for wireless charging includes a dry method, a wet etching method, a method in which an antenna is formed by punching a copper foil, and a method in which a copper wire is embedded in a substrate as a conductor of an antenna coil. Currently, since the wet etching method is to form an antenna pattern by corroding parts except for an antenna wire by using strong acidic chemicals, not only excessively high cost is required but also strong acidic chemicals are used, thereby causing environmental pollution which requires installation of separate anti-pollution facilities and pollution neutralizing systems. On the other hand, the dry etching method and the method of manufacturing an antenna by punching a copper foil, which are similar to the wet etching method regarding a shape of the formed antenna shape, compensate for a disadvantage of the wet etching method by allowing the antenna pattern to be generated mechanically without using chemical substances. Therefore, forming antennas by dry etching and forming antennas by the mechanical method of punching copper foil have been widely used in recent years. However, whether using the dry etching method or the method of bonding an antenna by punching copper foil, the use of adhesives is inevitable in order to attach antenna coils on a substrate, resulting in poor durability. Particularly, in order to increase efficiency between transmitting and receiving antennas, such as for wireless charging, a stack is formed in which several layers of copper foil antennas are stacked to expand the surface of the antenna coil (conductor). In order to stack several layers of copper foil antennas, high-efficiency adhesives are used to securely attach each layer. At this time, there are disadvantages of loss of charging efficiency due to the adhesives, which is a dielectric material that impairs the efficiency between transmission and reception, an additional process, an increase in defect rate, and an increase in production cost due to purchase of the adhesives. On the other hand, the method of embedding one line of copper wire as a conductor of the antenna coil is advantageous in that it is easy to manufacture; and since it is formed as a single layer and thus there are no inter-layer interfering materials, it is possible to increase efficiency between transmission and reception. However, since antenna diameter should be increased enough to widen the antenna surface area, this method may not be suitable for miniaturization of electronic devices due to increased thickness of the antenna device.

Referring to FIG. 1, a conventional art of manufacturing a wireless charging antenna includes preparing a circuit substrate (S100), cutting a copper foil sheet into a predetermined shape by a cutting device such as a laser (S102), and attaching the cut copper foil sheet to the circuit substrate after applying an adhesive under the cut copper foil sheet (S103).

Further, a method of attaching a copper foil on a substrate by applying the adhesive after punching the copper foil using a punching tool is widely used, instead of a physical/chemical cutting method.

However, the above dry etching method or a punching method is mainly used as the method of manufacturing the conventional wireless charging antenna. These methods use fine and elaborate processes to securely attach an elaborately processed copper sheet antenna coil on a base film, which increases manufacturing cost. In addition, due to the application of the adhesive between layers, current loss occurs due to dielectric properties of the adhesive and since it is a method of forming a single antenna coil by cutting a thin sheet of 20-30 microns, the antenna coil can be easily damaged by a small force. Thus, the manufacturing process, such as having to form a separate protective film to protect the antenna coil, is very complicated and all subsidiary materials such as copper foil, adhesives, and base films must also use high-purity materials, thereby increasing manufacturing cost.

Further, the above conventional art requires a broader antenna coil surface to obtain a higher charging current at a time of charging. When using the copper foil sheet as the antenna coil (including in the etching methods and the punching method), the antenna coil surface is improved by stacking two or three layers. The antenna patterns between the layers should be matched with each other to reduce interference between antenna patterns. Thus, the stacking process is an elaborate process, which may increase process steps of the processes and defect rates. Also, the greater demands for electric energy for the wireless charging is at a time of wireless charging, the higher the elaboration required.

DISCLOSURE

Technical Problem

Accordingly, the present disclosure, whose purpose is to solve the above problems, provides a manufacturing apparatus for a wireless charging antenna, a method of manufacturing the same, and the wireless charging antenna to improve antenna efficiency and reduce manufacturing cost as well.

Another purpose of the present disclosure is to provide a manufacturing apparatus for the wireless charging antenna, a method of manufacturing the same, and the wireless charging antenna, which can significantly improve antenna manufacturing yield, by minimizing errors in the manufacturing process due to an increase in the thickness of the overlapping area because the bridge is processed with thin copper foil at the overlapping portion of the wire in the manufacturing process.

Technical Solution

In one aspect of the present disclosure, an antenna manufacturing apparatus comprising: a base frame on which an antenna substrate sheet is mounted; a center frame disposed on a center portion of the base frame; an embedding head structure coupled to the center frame and for embedding a plurality of wires on the antenna substrate sheet in parallel simultaneously; a welding module structure coupled to the center frame and welding antenna patterns including the plurality of wires to a connecting printed circuit board (PCB); and a copper foil attaching structure forming a bridge for connecting an end terminal of the plurality of wires and the connecting PCB.

In an embodiment, the bridge comprises a copper foil or a composite including at least the copper foil.

In an embodiment, the embedding head structure comprises an embedding head module supplying the plurality of wires, and an ultrasonic vibration member coupled to the embedding head module and generating a predetermined energy via ultrasonic vibration to melt the antenna substrate sheet.

In an embodiment, the embedding head structure comprises: a plurality of wire spools at its upper end, each of the plurality of wire spools supplying each of the wires, and a wire supply rotation plate member being configured to be rotatable.

In one aspect of the present disclosure, a method of manufacturing an antenna device comprising: embedding a plurality of wires on an antenna substrate sheet in parallel simultaneously; forming a bridge for connecting an end terminal of the plurality of wires and a connecting printed circuit board (PCB); and welding a starting terminal of the plurality of wires and both terminals of the bridge.

In an embodiment, the method further comprises, prior to any one of the embedding the plurality of wires, the forming the bridge and the welding the starting terminal and the both terminals, attaching the connecting PCB on the antenna substrate sheet.

In an embodiment, the method further comprises, prior to the embedding the plurality of wires, forming one or more openings on the antenna substrate sheet.

In an embodiment, at least one of a plurality of connecting terminals of the connecting PCB is positioned in the one or more openings.

In one aspect of the present disclosure, an antenna device comprising: an antenna substrate sheet to which a connecting printed circuit board (PCB) is attached; and an antenna pattern which starts from one of a plurality of connecting terminals of the connecting PCB and ends at another one of the plurality of connecting terminals, wherein the antenna pattern comprises a plurality of wires which functions as one line embedded on the antenna substrate sheet, and a bridge for connecting the connecting PCB and the plurality of wires embedded on the antenna substrate sheet.

In an embodiment, one or more openings are formed on the antenna substrate sheet and at least one of the plurality of connecting terminals of the connecting PCB is positioned in the one or more openings.

In an embodiment, a starting terminal of the plurality of wires and both terminals of the bridge are welded.

In one aspect of the present disclosure, an antenna device comprising: an antenna substrate sheet to which a connecting printed circuit board (PCB) is attached; and an antenna pattern which starts from one of a plurality of connecting terminals of the connecting PCB and ends at another one of the plurality of connecting terminals. The antenna pattern includes a plurality of wires which functions as one line embedded in the antenna substrate sheet. The starting terminal of the plurality of wires is welded at a position of a first terminal of the connecting PCB, and a point where winding of the plurality of wires on the antenna substrate sheet is completed is welded at a position of terminal 2 of the connecting PCB.

Advantageous Effects

According to one embodiment of the present disclosure, a hybrid process in which a rotatable embedding head module and a co-rotating wire supply module in synchronization with the rotatable embedding head module are provided is used to manufacture a wireless charging antenna. In the embodiment, a plurality of wires is parallelly embedded on a substrate sheet to function as one line and a copper foil is bridged at the end terminal of the wires without the wires being crossed over each other. Thus, charging efficiency of the wireless charging antenna is improved and manufacturing cost for the wireless charging antenna is reduced as well.

In addition, since the wire is bridged with a thin copper foil at the overlapping portion of the wire, the thickness of the overlapping portion is thinned, so that the antenna according to an exemplary embodiment of the present disclosure can be used in a slim electronic device.

DESCRIPTION

Various modification would be applied to the present disclosure, and the present disclosure can have many embodiments. Specific embodiments are illustrated as figures and explained in the description. These do not restrict the present disclosure with the specific embodiments, but it should be understood that concepts, all modifications included in technological boundary, equivalent and substitute of the present disclosure are included in the present description. Where it is believed that specific explanations for related conventional art might make the present disclosure vague, the specific explanations are omitted.

The terms such as 'a first,' 'a second,' etc., can be used for explaining various components, but the components are not limited to the term. The term is only used for distinguishing one component from another.

The language used in the description is only for explaining specific embodiments but not limiting the present disclosure. A singular number includes expressions of plural numbers except that the singular number is used explicitly in the context. In the description, a term "include," or "have," etc., is used for indicating existence of features, numbers, steps, actions, components, elements, parts or combinations thereof not for excluding the existence or possibility of adding one or more other features, numbers, steps, actions, components, elements, parts or combinations thereof.

Further, where it is believed that specific explanations for related conventional art might make the present disclosure vague, the specific explanations are omitted.

Hereinafter, embodiments of the present disclosure will be described in detail with reference to the accompanying drawings.

Figure 1:
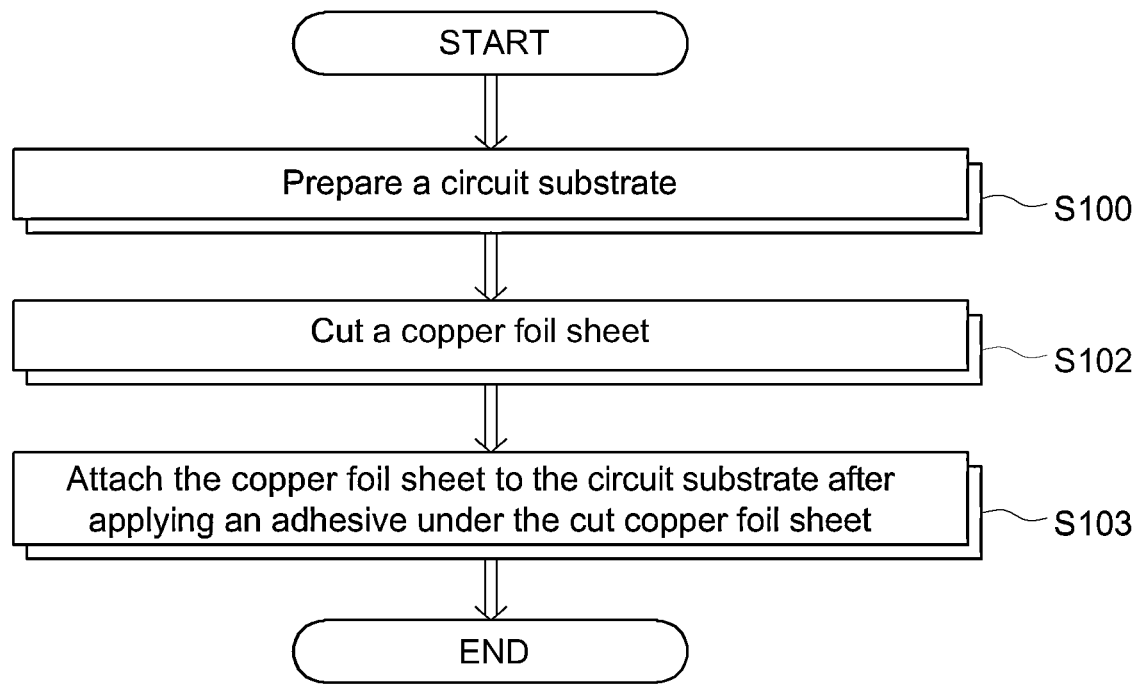
FIG. 1 is a flow chart explaining an example of a conventional art for manufacturing a wireless charging antenna.
Figure 2:
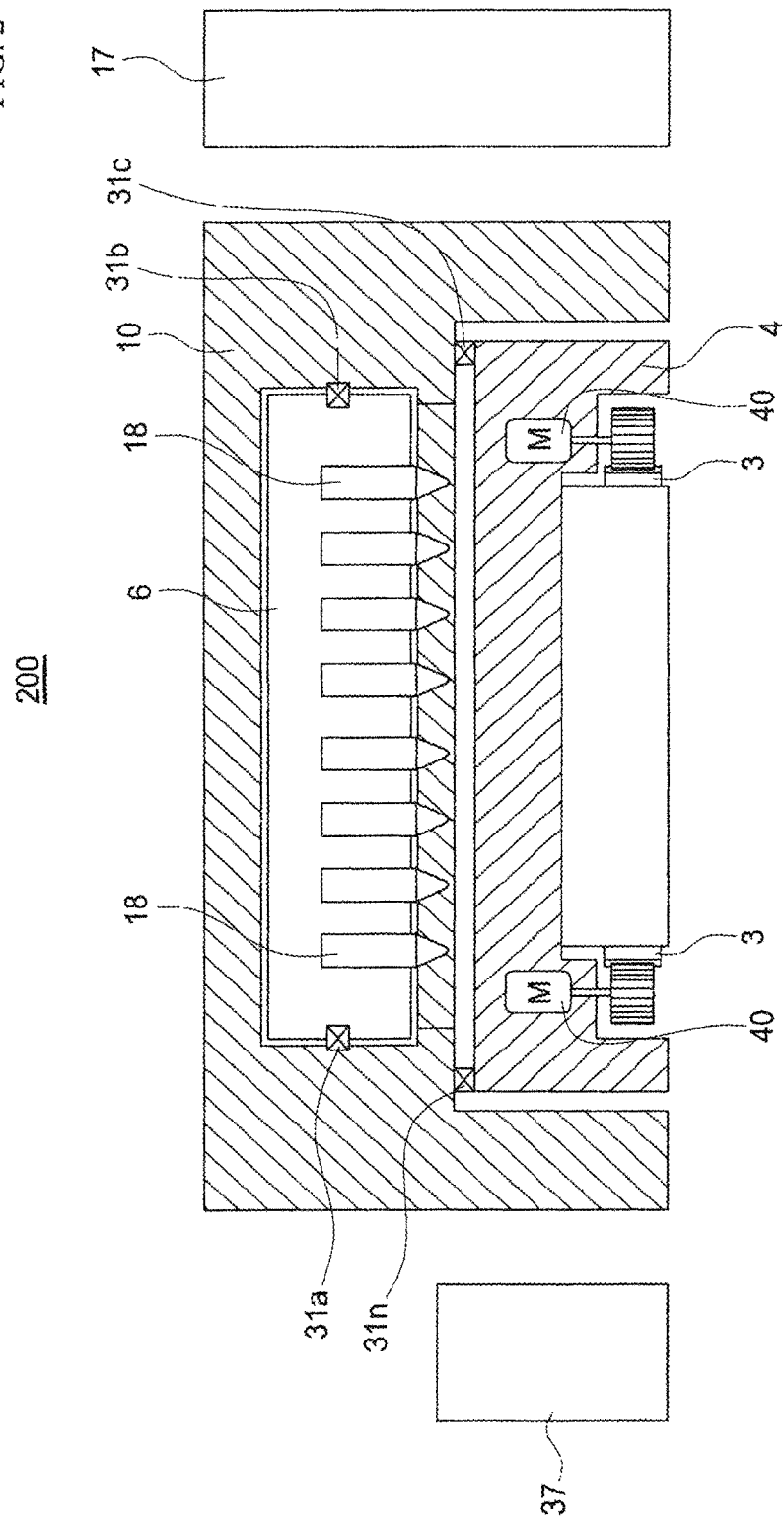
FIG. 2 is a schematic view of an apparatus for manufacturing a wireless charging antenna in accordance with an embodiment of the present disclosure.
Figure 3:
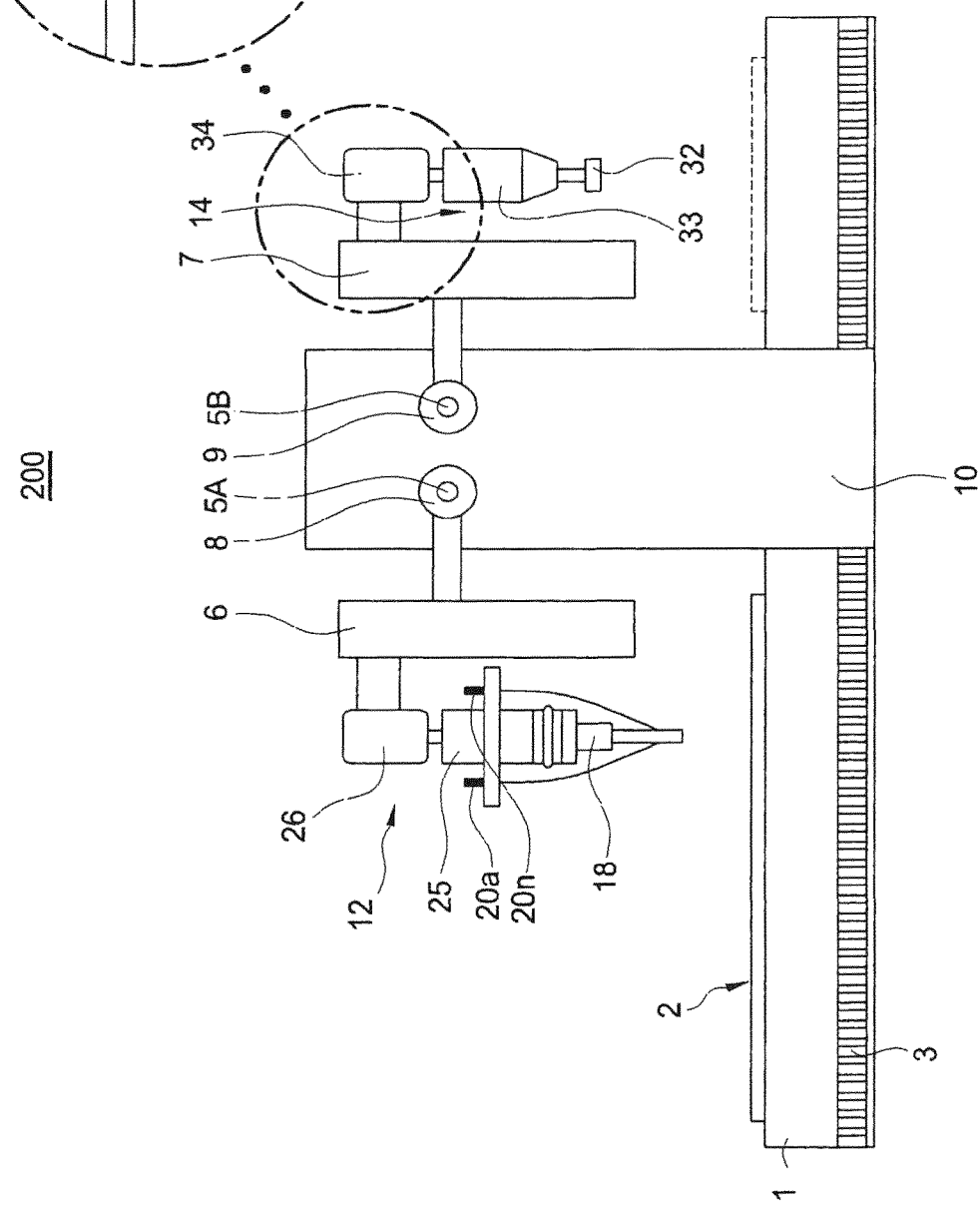
FIG. 3 is schematic side view of an apparatus for manufacturing a wireless charging antenna in accordance with an embodiment of the present disclosure.
Figure 4:
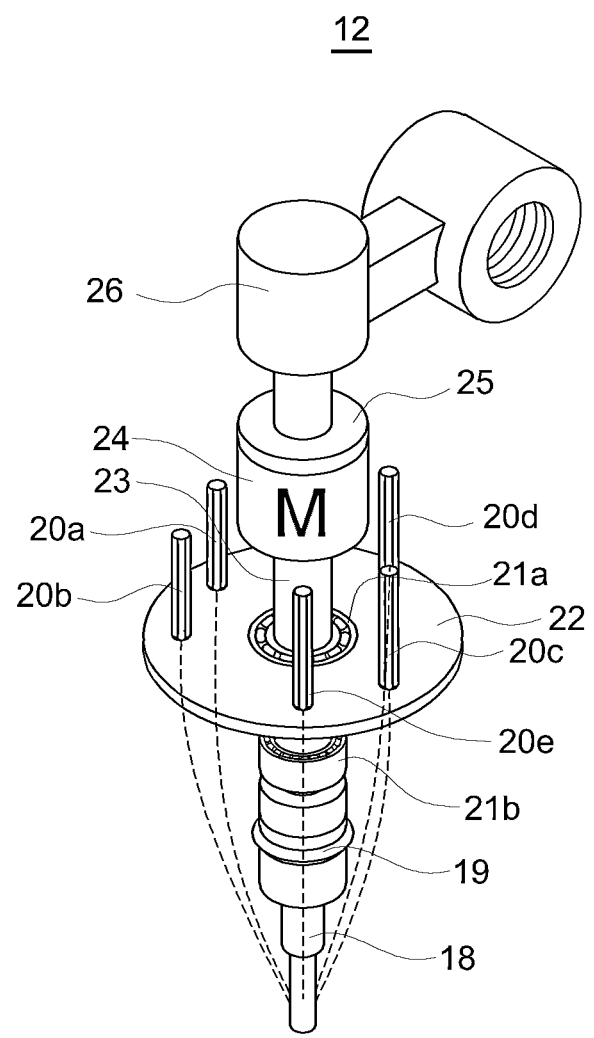
FIG. 4 is a partially enlarged view of a portion of an embedding head structure in accordance with an embodiment of the present disclosure.
Figure 5A:
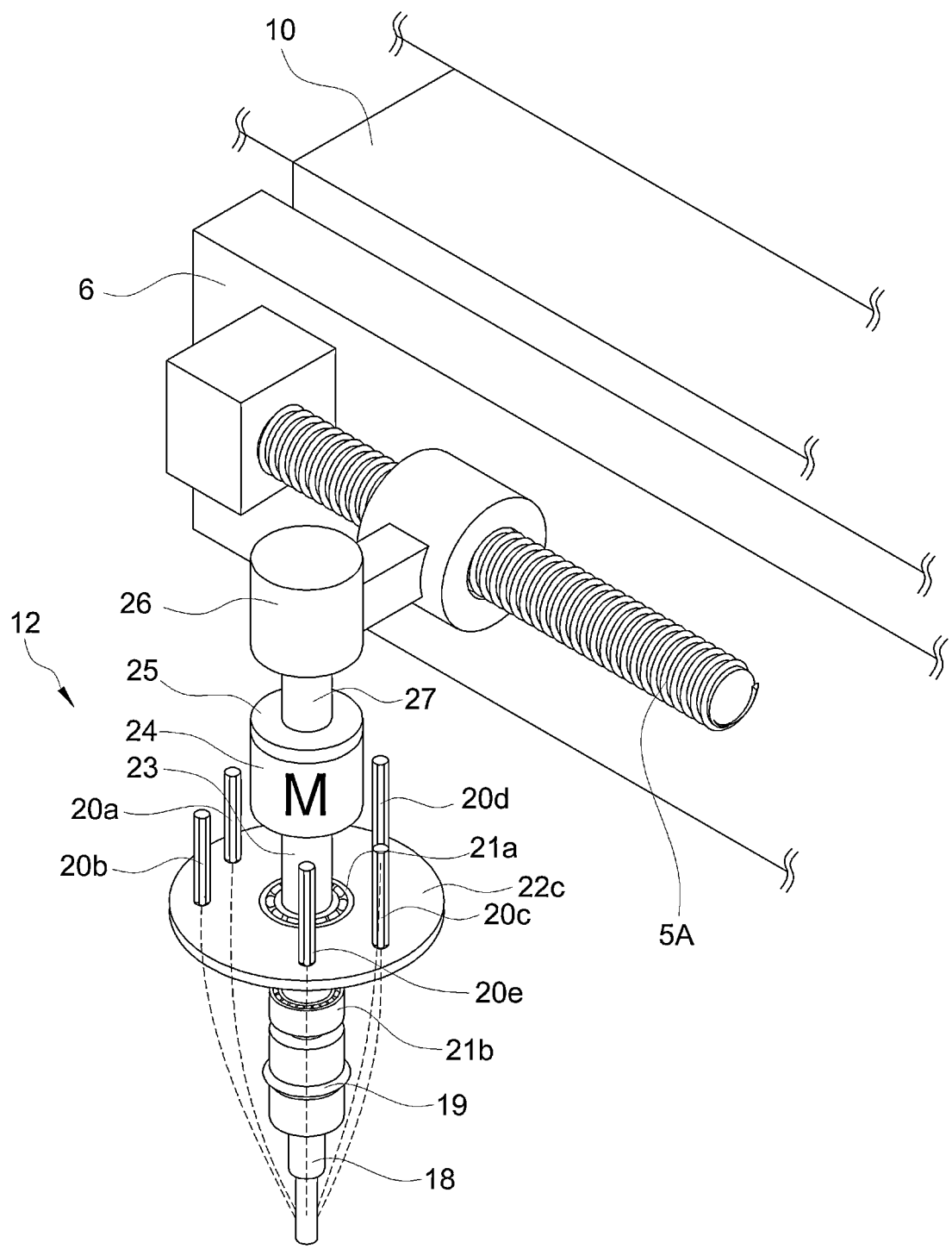
FIG. 5A is a schematic view of peripheral portions of the embedding head structure in accordance with an embodiment of the present disclosure.
Figure 5B:
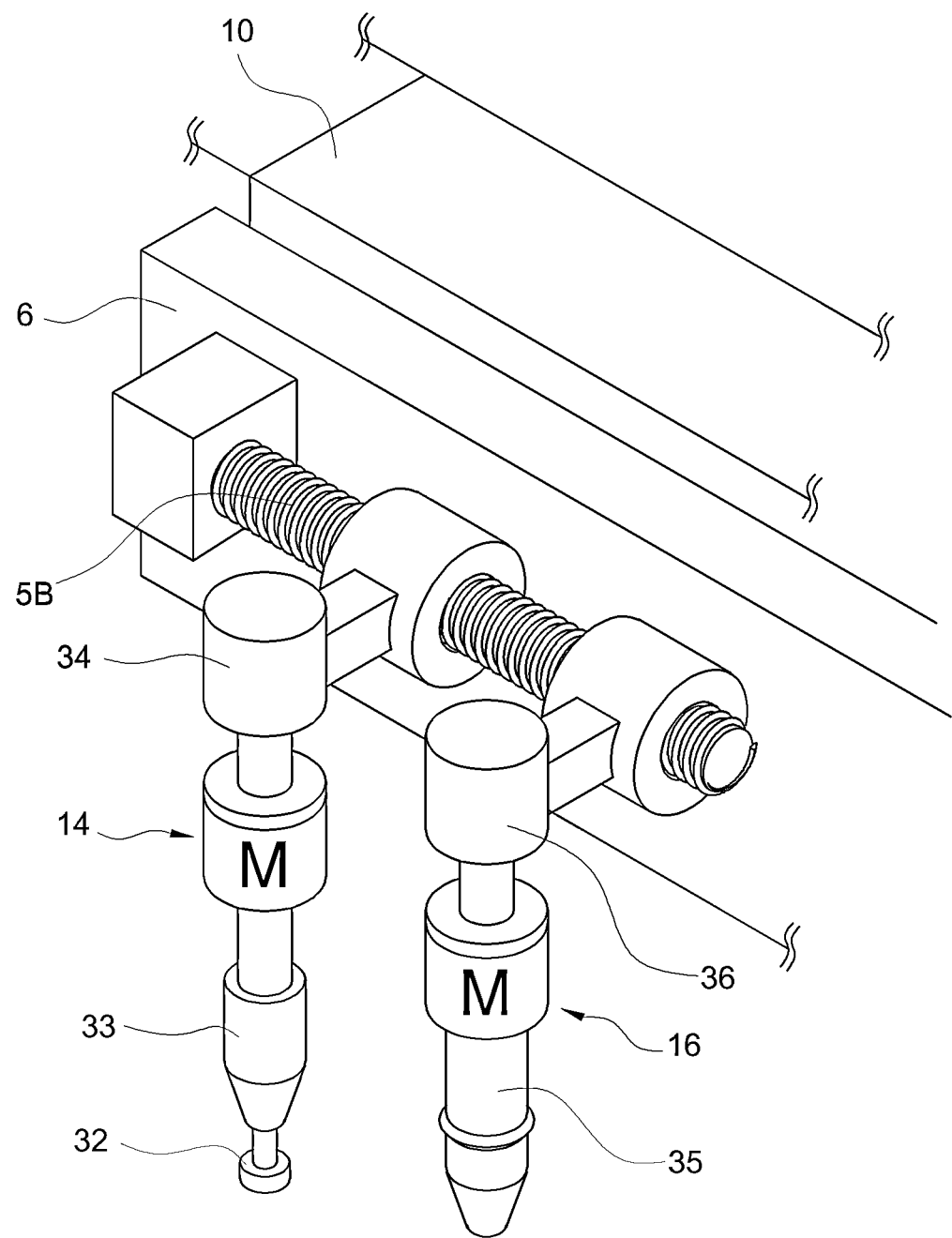
FIG. 5B is a schematic view explaining peripheral portions of a copper foil attaching structure and a welding module structure in accordance with an embodiment of the present disclosure.
Figure 6A:
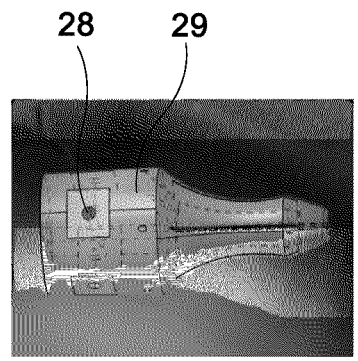
FIGS. 6A to 6D are schematic views illustrating a wire nozzle of the embedding head structure in accordance with an embodiment of the present disclosure.
Figure 6B:
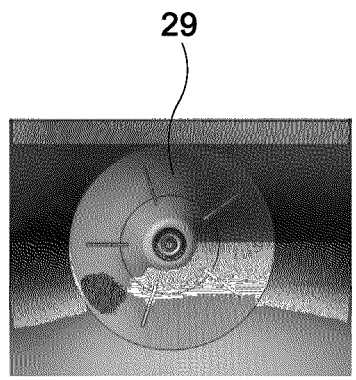
Figure 6C:
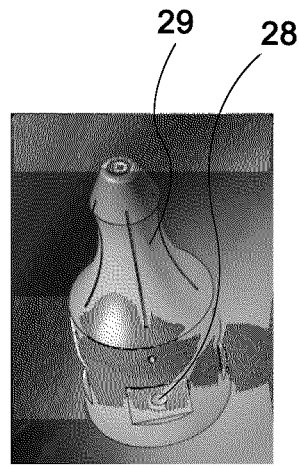
Figure 6D:
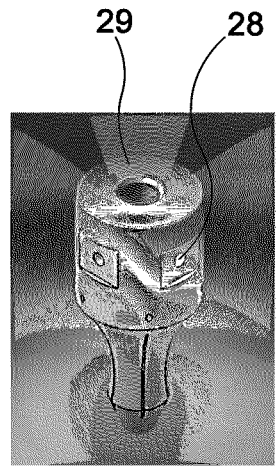
Figure 7A:
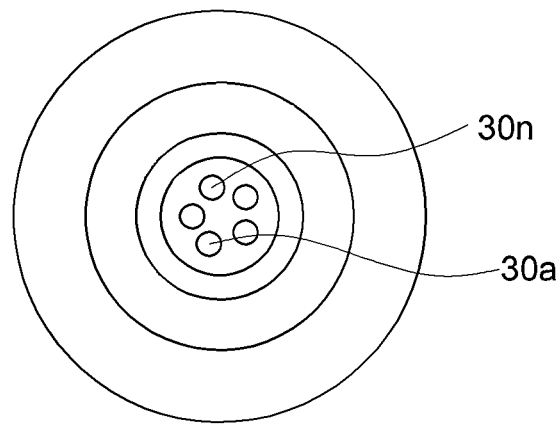
FIGS. 7A and 7B are partially enlarged views of a cross section of the wire nozzle in FIG. 6A to 6D.
Figure 7B:
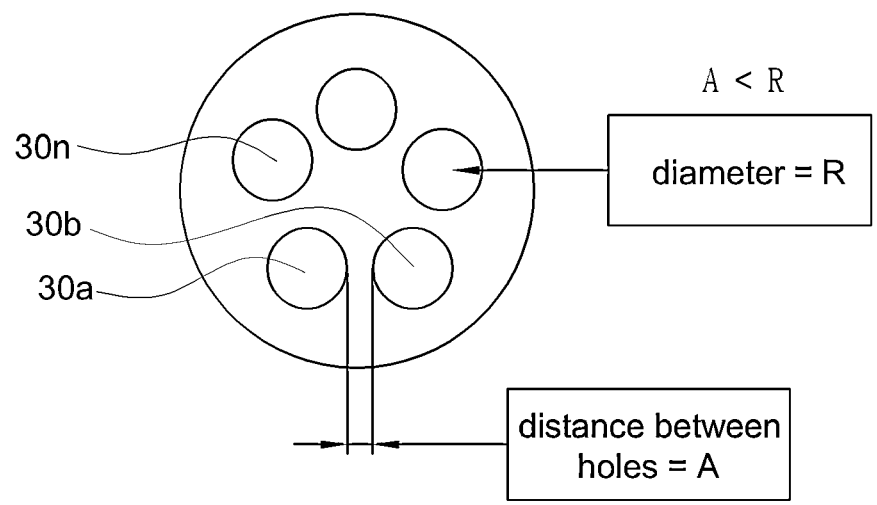
Figure 8:
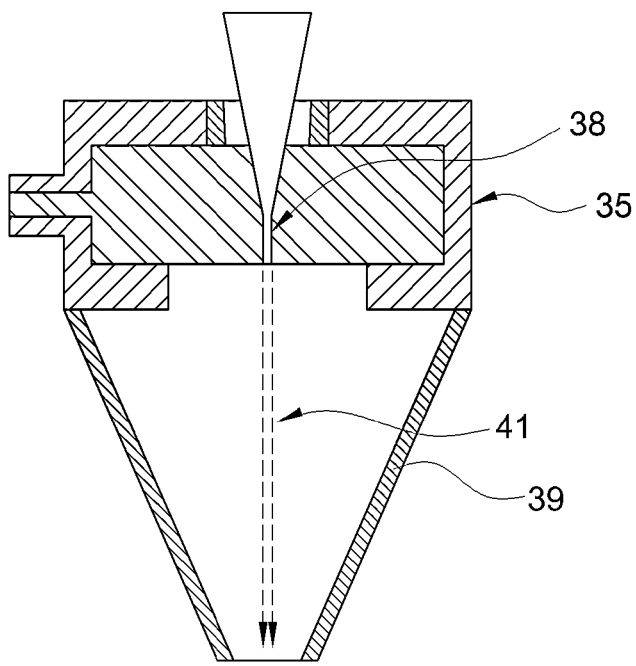
FIG. 8 is a partially enlarged view illustrating the welding module structure in accordance with an embodiment of the present disclosure.
Figure 9:
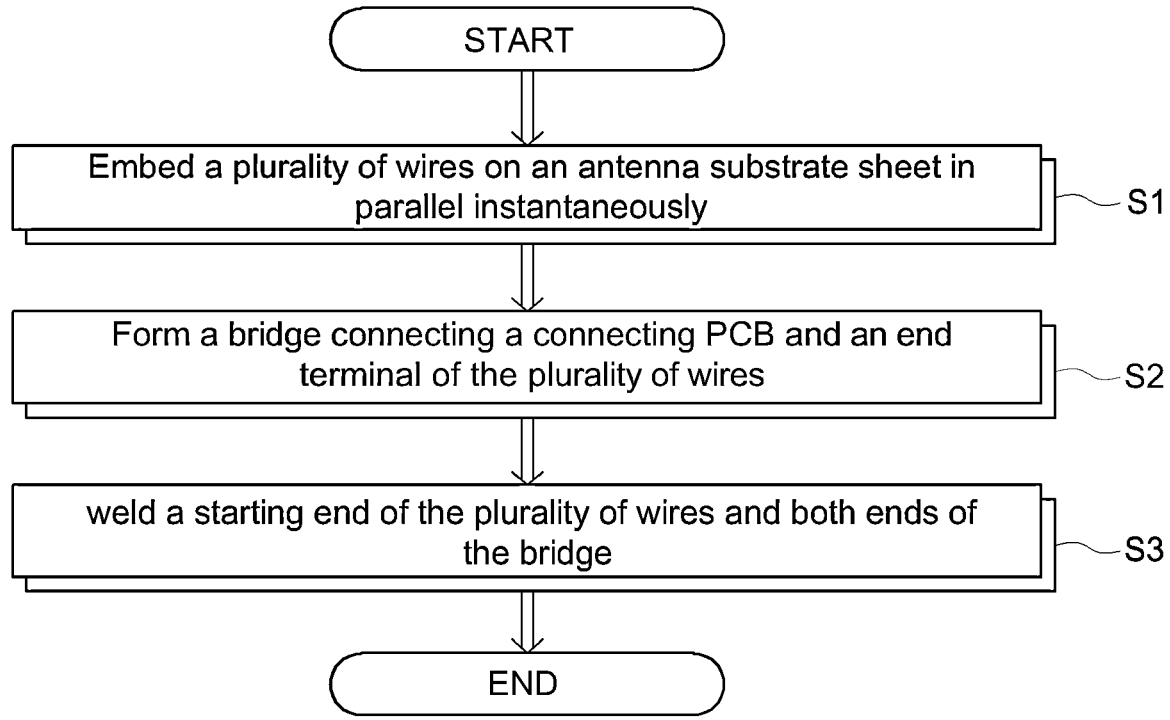
FIG. 9 is a flow chart explaining a method of manufacturing the antenna device in accordance with an embodiment of the present disclosure.
Figure 10A:
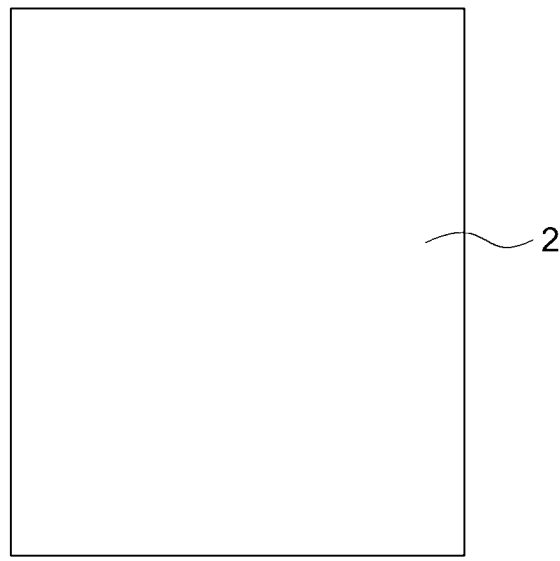
FIGS. 10A to 10G are a view further specifically explaining manufacturing processes of the wireless charging antenna device in accordance with an embodiment of the present disclosure.
Figure 10B:
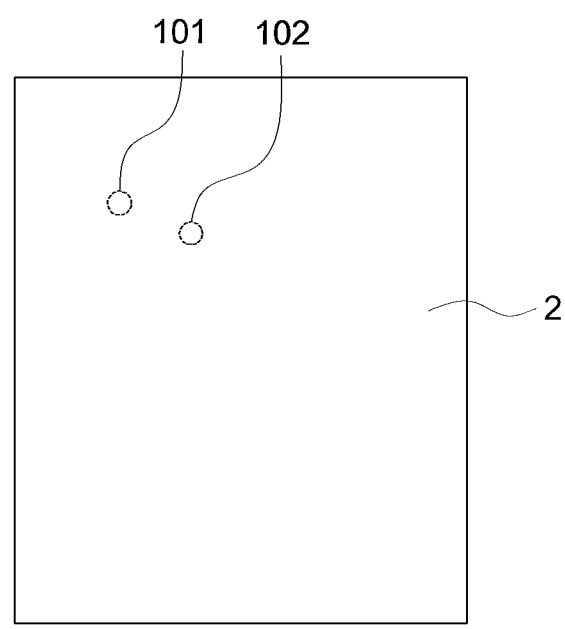
Figure 10C:
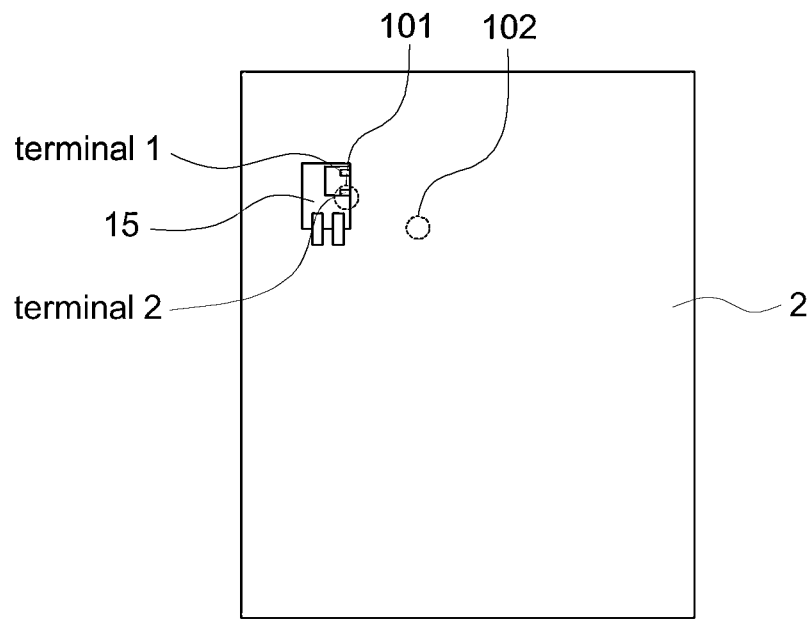

FIG. 2 is a schematic view of an apparatus for manufacturing a wireless charging antenna in accordance with an embodiment of the present disclosure. FIG. 3 is a schematic side view of an apparatus for manufacturing a wireless charging antenna in accordance with an embodiment of the present disclosure. FIG. 4 is a partially enlarged view of a portion of an embedding head structure in accordance with an embodiment of the present disclosure. FIG. 5A is a schematic view of peripheral portions of the embedding head structure in accordance with an embodiment of the present disclosure. FIG. 5B is a schematic view explaining peripheral portions of a copper foil attaching structure and a welding module structure in accordance with an embodiment of the present disclosure. FIGS. 6A to 6D are schematic views illustrating a wire nozzle of the embedding head structure in accordance with an embodiment of the present disclosure. FIGS. 7A and 7B are a partially enlarged view of a cross section of the wire nozzle in FIGS. 6A to 6D. FIG. 8 is a partially enlarged view illustrating the welding module structure in accordance with an embodiment of the present disclosure. FIG. 9 is a flow chart explaining a method of manufacturing the antenna device in accordance with an embodiment of the present disclosure. FIGS. 10A to 10G are a view further specifically explaining manufacturing processes of a receiving antenna device for wireless charging in accordance with an embodiment of the present disclosure. FIG. 11 is a view explaining embedding processes embedding the plurality of wires simultaneously by the embedding head module in the manufacturing processes shown in FIGS. 10A to 10G.

A manufacturing apparatus 200 for a receiving antenna for hybrid wireless charging in accordance with the present disclosure comprises a base frame unit 4, a center frame unit 10, one or more embedding head structure 12, a copper foil attaching structure 14, a welding module structure 16, and a control unit 17. The base frame unit 4 is formed as a box-shape with a predetermined size, as illustrated in FIGS. 2 and 3, and an antenna substrate sheet 2 is mounted on an upper plate 1 of a body of the base frame unit 4. The base frame unit 4 moves a back and forward direction along a guide rail 3 installed at a lower portion of the body of the base frame unit 4. Screw rods 5A, 5B are installed on a center portion of the base frame 4 in an upper and a lateral direction with a certain interval. The center frame unit 10 is formed to be coupled with a first transfer coupling member 8 of a first transfer plate member 6 and a second transfer coupling member 9 of a second transfer plate member 7, respectively, with a screw method with screw rods 5A, 5B. The embedding head structure 12 embeds a plurality of wires 11a-11n (e.g., three, five, seven wires, etc.; five wires in FIG. 11), which functions as one line and moves in an upper, lower, left and right direction on the antenna substrate sheet 2, in parallel simultaneously. One or more embedding head structure 12 are installed on the first transfer plate member 6 with a certain interval and move in the back and forward direction. One or more copper foil attaching structure 14 are installed on the second transfer plate member 7 with a certain interval and are mounted on the base frame unit 4. The copper foil attaching structure 14 moves in the upper, lower, left, and right direction on an end terminal of the wires 11a-11n of the antenna substrate sheet 2 where the wires 11a-11n are embedded. The copper foil attaching structure 14 attaches a cooper foil or a composite including at least the copper foil to form a bridge 13 without crossover of the wires 11a-11n. One or more welding module structure 16 are installed on the second transfer plate member 7 with a certain interval and are mounted on the base frame unit 4. The welding module structure 16 welds a connecting PCB (which is also referred as "a finger PCB") of the antenna substrate sheet 2 where the bridge 13 had been formed with a cooper foil by moving the connecting PCB in the upper, lower, left, and right direction. The control unit 17 controls processes for manufacturing the wireless charging antenna in accordance with a program. The program is set to embed the plurality of wires 11a-11n (e.g., three, five, seven wires, etc.) in parallel simultaneously on the antenna substrate sheet 2 by the embedding head structure 12; form the bridge 13 with the copper foil on the antenna substrate sheet 2 where the embedding of the wires is completed by the copper foil attaching structure 14; and weld the connecting PCB 15 of the antenna substrate sheet 2 where the bridge 13 had been formed by the welding module structure 16. (For convenience, the welding module structure 16 is illustrated on a right upper side of FIG. 3 because the copper foil attaching structure 14 hides the welding module structure 16 in FIG. 3.)

For example, the composite including the copper foil has a structure where the copper foil is attached to a flexible printed circuit board (FPCB).

Further, the embedding head structure 12, as illustrated in FIG. 4, includes an embedding head module 18, an ultrasonic vibration member 19, a wire supply rotation plate member 22, an embedding rotation motor 24, and an embedding pneumatic cylinder 26. The embedding head module 18 embeds the plurality of wires 11a-11b in parallel on the antenna substrate sheet 2 according to control of the control unit 17. The plurality of wires 11a-11n is inserted at a lower portion of a body of the embedding head module 18. The embedding head module 18 is 360 degrees rotatable. The ultrasonic vibration member 19 is coupled to an upper portion of the embedding head module 18. The ultrasonic vibration member 19 generates energy on an end-most portion of the embedding head module 18 via ultrasonic vibration according to the control of the control unit 17 to liquefy the antenna substrate sheet 2 instantaneously. The wire supply rotation plate member 22 is coupled to an upper portion of the ultrasonic vibration member 19 with bearings 21a, 21b and is 360 degrees rotatable in conjunction with the embedding head module 18. The wire supply rotation plate member 22 is disk-shaped. Wire spools 20a-20n for supplying the plurality of wires 11a-11n to the embedding head module 18 are formed on the wire supply rotation plate member 22. The embedding rotation motor 24 rotates the embedding head module 18 and the wire supply rotation plate member 22 in a predetermined angle under the control of the control unit 17. The embedding rotation motor 24 is coupled to the wire supply rotation plate member 22 at the center of the wire supply rotation plate member 22 with the bearings 21a, 21b. The embedding pneumatic cylinder 26 is coupled to an upper portion of the embedding rotation motor 24 with a coupling fixing member 25 and transfers the body of the embedding head structure 12 fixed on the coupling fixing member 25 in an upper and lower direction under the control of the control unit 17 with pneumatic pressure.

Here, the coupling fixing member 25, as illustrated in FIGS. 4, 5A, 5B, an upper portion of a body of the coupling fixing member 25 is coupled to a pneumatic rod 27 of the embedding pneumatic cylinder 26 and the upper portion of the embedding rotation motor 24 is coupled to an opposite lower portion of the embedding pneumatic cylinder 26 with screw coupling. Thus, the coupling fixing member 25 is installed to be movable together with an entire body of the embedding head structure 12. As illustrated in FIGS. 6A-6D, a plurality of insertion holes 28 (e.g., five holes) to which wires are supplied from the wire spool 20a-20e is formed on a side circumference of the body of the embedding head module 18. Holes 30a-30n, which form, for example, a hexagonal shape, are formed on a cross section of a lowermost wire nozzle 29 of the embedding head module 18 as illustrated in FIGS. 7A and 7B. It is preferred that a distance (A) between the holes 30a and 30b is smaller than a diameter (R) of the holes. The numbers or the shape of the holes 30a and 30b can be various and modified although the above descriptions explain that five holes 30a-30n are formed in the hexagonal shape.

Detection sensors 31a-31n are installed on the base frame unit 4 and the center frame unit 10, respectively. The detection sensors 31a-31n detects detection points set by the control unit 17 or upper, lower, left and right moving traces of the embedding head module 18, the copper foil attaching structure 14 and the welding module structure 16; and send the detection points to the control unit 17.

The copper foil attaching structure 14 has a plurality of vacuum adsorption nozzles 32 for adsorbing an object with vacuum and is located under a body thereof, as illustrated in FIGS. 2, 3, 5B. The copper foil attaching structure 14 further includes a copper attaching module 33 and a copper pneumatic pressure cylinder 34. The copper attaching module 33 attaches the copper foil, etc., to form a bridge without crossover of the wires while moving in the upper, lower, left and right directions at an end terminal of the wires of the antenna substrate sheet 2 where the multiple wires are embedded under the control of the control unit 17. The copper attaching module 33 is 360 degrees movable. The copper pneumatic pressure cylinder 34 is fixed on the upper portion of the copper attaching module 33 via the coupling fixing member 25. The copper pneumatic pressure cylinder 34 moves the body of the copper attaching module 33 fixed on the coupling fixing member 25 in au upper and lower direction by pneumatic pressure under the control of the control unit 17.

In an embodiment of the present disclosure, the welding module structure 16 further includes, as illustrated in FIGS. 3, 5B, 8, a laser welding module 35 and a welding pneumatic cylinder 36. The laser welding module 35 welds the connecting PCB 15 by laser beam while moving the connecting PCB 15 of the antenna substrate sheet 2, where the bridge has been formed, in the upper, lower, left, and right directions. The welding pneumatic cylinder 36 is coupled to an upper portion of the laser welding module 35 via the coupling fixing member 25 and moves the body of the laser welding module 35 fixed on the coupling fixing member 25 in an upper and lower direction by pneumatic pressure under the control of the control unit 17.

In an embodiment of the present disclosure, a space for mounting the antenna substrate sheet 2, the connecting PCB 15, and the bridge 13 is formed on the base frame unit 4; and an adhesive supply device 37 for applying adhesive to the connecting PCB 15 and the bridge 13 may be prepared on the base frame unit 4.

Meanwhile, it is preferred that the embedding head module 18 is configured to prevent twisting of the multiple wires 11a-11n, for example, to connect the wires 11a-11n in parallel and form an antenna having a loop-pattern. The embedding head module 18 delivers ultrasonic vibrations transferred from the ultrasonic vibration member 19 to the antenna substrate sheet 2 with inserting the antenna wires 11a-11n into the holes 30a-30n formed in a head of the embedding head module 18. That is, when seen from above the antenna substrate sheet, the embedding head module 18 moves in x, y, and z directions and rotates.

In an embodiment, the laser welding module 35 includes a laser nozzle 38. As illustrated in FIG. 8, the laser welding module 35 irradiates a laser beam 41 with pressing the wires 11a-11n and the bridge 13, and wires 11a-11n, and the connecting PCB 15 with a welding head 39 in a welding process using the laser nozzle 38. A lower portion of the welding head 39 has a diameter which is 1.5-2.5 times larger than that of the antenna wire. An upper portion of the welding head 39 is coupled to a lower portion of the laser nozzle 38. It is preferred that the pressure for pressing the welding head 39 is about 10-25 kg/cm2.

Here, it is preferred that the wires 11a-11n are thin coils positioned in parallel in order to make them thinner and wider like an etched or punched copper foil antenna.

Meanwhile, the base frame unit 4 may include a pinion gear member 40 for moving the base frame unit 4 in the back and forward direction in conjunction with the guide rail 3 installed at the lower portion of the body of the base frame unit 4. When embedding the wires 11a-11n is completed, the base frame unit 4 moves to an opposite side with reference to the center frame unit 10 to form the bridge 13 and to perform the welding process.

FIG. 9 is a flow chart explaining a method of manufacturing the antenna device in accordance with the present disclosure.

Referring to FIG. 9, the method may comprise embedding the plurality of wires 11a-11n on the antenna substrate sheet 2 in parallel simultaneously (S1), forming the bridge 13 for connecting the connecting PCB (for example, "terminal 1" in FIG. 10G) 15 and the end terminal ("C" in FIG. 10G) of the plurality of wires 11a-11n(S2), and welding a starting terminal ("B" in FIG. 10G) of the plurality of wires 11a-11n and both end terminals of the bridge 13 ("terminal 2" and "C" in FIG. 10G) (S3).

In an embodiment, prior to any one of S1, S2, and S3, the method may comprise attaching the connecting PCB 15 to the antenna substrate sheet 2.

In an embodiment, the method may comprise, prior to S1, forming one or more openings ("101," "102" in FIGS. 10B-10G) in the antenna substrate sheet 2. Referring to FIG. 10G, opening may not be necessary because the bridge 13 is located on the antenna substrate sheet 2. However, in case of disposing the bridge 13 on the lower portion of the antenna substrate sheet 2, the bridge 13 may be attached to the antenna substrate sheet 2 by welding the openings 101, 102, i.e., both terminals ("terminal 2" and "C" in FIG. 10G) of the bridge 13.

In another embodiment, a single longitudinal opening, instead of circular openings 101, 102, is formed; the connecting PCB 15 is disposed at the lower portion of the antenna substrate sheet 2; and terminals 1 and 2 of the connecting PCB 15 may be positioned in the single longitudinal opening. That is, all terminals 1 and 2 are disposed in the single longitudinal opening in this embodiment, instead of positioning only terminal 2 in the opening 101. In this case, the bridge 13 may be disposed on the antenna substrate sheet 2.

In an embodiment of the present disclosure, the antenna substrate sheet 2, to which a wire embedding may be applied by ultrasonic wave, is prepared prior to S1. The antenna substrate sheet 2 may comprise material such as PVT, PET, Teslin, etc.

In an embodiment of the present disclosure, the method may comprise a hole punching step (FIG. 10B) forming a hole whose diameter is similar to a thickness of the wires 10a-11b by punching the openings ("101" and "102" in FIG. 10B) with a laser tool or a punching tool (not shown) on the antenna substrate sheet 2 in case of disposing the bridge 13 on the lower portion of the antenna substrate sheet 2. Thus, the connecting PCB 15 may be attached as illustrated in FIG. 10C.

Figure 10D:
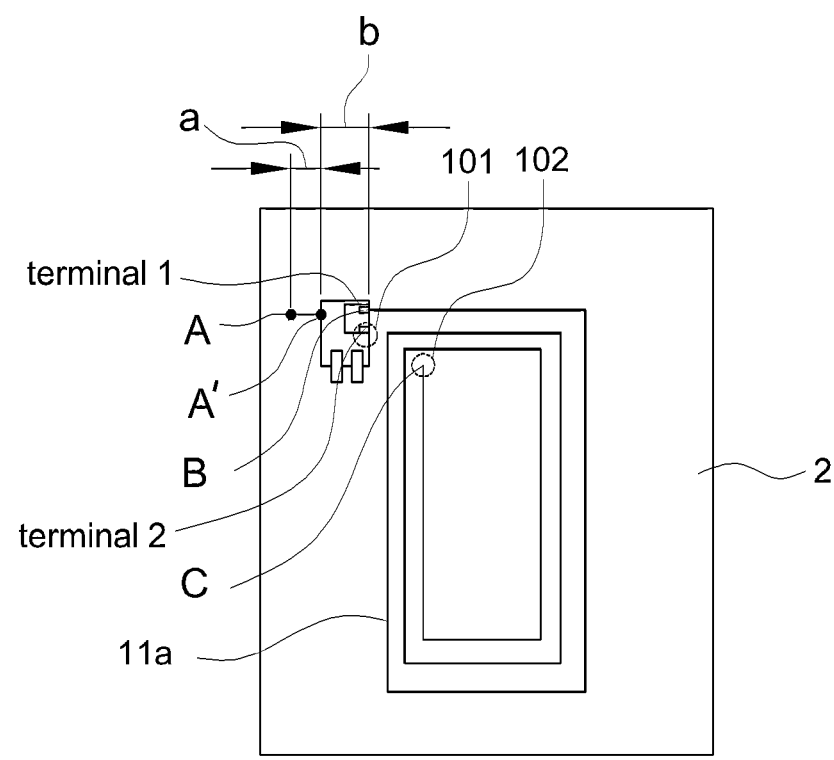
Figure 11:
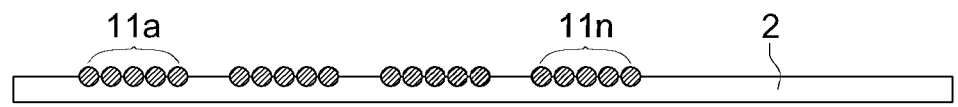
FIG. 11 is a view explaining embedding processes embedding the plurality of wires simultaneously by the embedding head module in the manufacturing processes shown in FIGS. 10A to 10G.

As illustrated in FIGS. 10D and 11, for example, the antenna may be formed by the following processes. A section "a" starting from point A with five parallel wires is formed. When the wires 11a-11n arrive at point A', the embedding head module 18 is driven to hold the antenna wires 11a-11n and lifts the wires 11a-11n with a height higher than the thickness of the connecting PCB 15 such that the wires 11a-11n are positioned on the connecting PCB 15 (at this time, the wires 11a-11n are not embedded on the connecting PCB 15). Then, the antenna is formed by lowering the wires 11a-11n with a height of point A' when the wires 11a-11n arrive at point B. When the wires 11a-11n arrive at point C, forming of the antenna is stopped.

During these processes, the wires 11a-11n are formed in parallel on the antenna substrate sheet 2 mounted in the base frame unit 4 which moves in the back and forward direction under the embedding pneumatic cylinder 26 by moving the embedding pneumatic cylinder 26 coupled to the upper portion of the embedding head module 18. The control unit 17 moves the first transfer coupling member 8 of the first transfer plate member 6 which is screw-coupled to the screw rods 5A, 5B formed on the center frame unit 10 such that the embedding pneumatic cylinder 26 coupled to an upper end of the embedding head module 18 moves up and down while moving the embedding head module 18 coupled to the first transfer plate member 6 in the left and right direction. As a result, the wires 11a-11n are formed in parallel on the antenna substrate sheet 2. At this time, the embedding head module 18, as illustrated in FIG. 11, forms, for example, five wires; and at the same time the control unit 17 drives the ultrasonic vibration member 19 located on the upper end of the embedding head module 18 to generate a predetermined energy by ultrasonic vibration. The energy instantaneously melts the antenna substrate sheet 2 and the wires 11a-11n outputted from the embedding head module 18 to embed the wires 11a-11n on the antenna substrate sheet 2.

The antenna formed by, for example, the five wires 11a-11n in parallel functions as one line in case of being embedded by each of the embedding head modules 18. The antenna is wound multiple times on the antenna substrate sheet 2 (FIG. 10G).

Figure 10E:
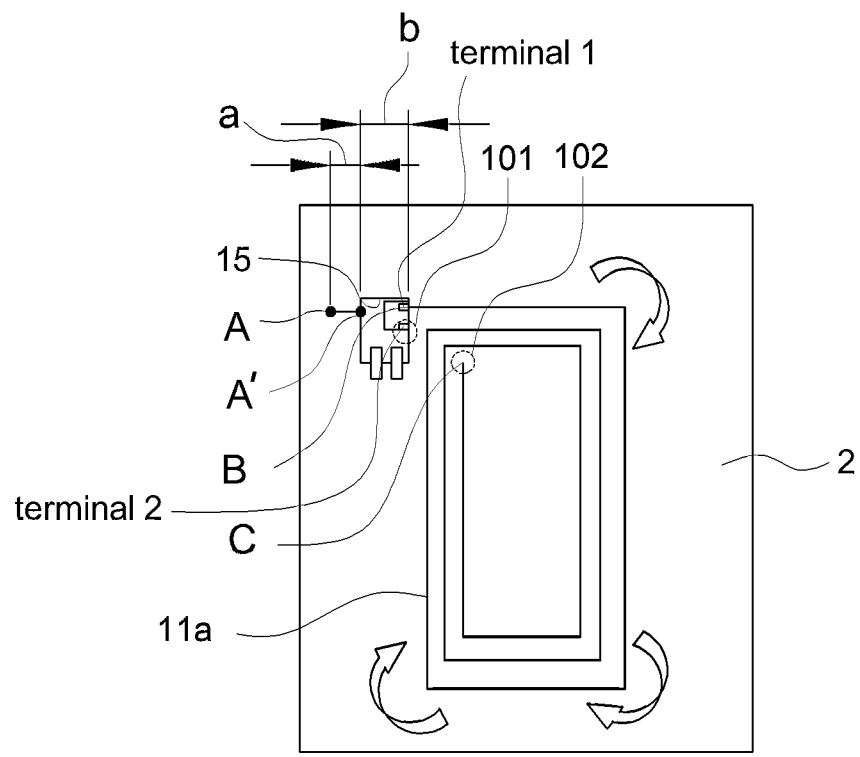

The control unit 17 controls the embedding head module 18 to rotate along an angle and a direction as the same as those of wires 11a-11n as illustrated in FIG. 10E. That is, the control unit 17 drives the embedding rotation motor 24 to rotate the embedding head module 18 along an angle and a direction of the wires 11a-11n with 360 degrees, and at the same time the wire supply rotation plate member 22 on the embedding head module 18 rotates 360 degrees in conjunction with the embedding head module 18 to unwind the wires 11a-11n from the wire spools 20a-20n. Thus, since the embedding head module 18 and the wire supply rotation plate member 22 rotate in conjunction with each other to form one turn of the antenna wires 11a-11n, the wires 11a-11n do not overlap or twist each other even when the antenna wires having a circular shape 11a-11n are embedded on the antenna substrate sheet 2. When the embedding of antenna wires 11a-11n is completed by rotation of the embedding head module 18, the control unit 17 stops an operation of the embedding head module 18. Then, a cutting knife (not shown) attached to an axis (not shown) of the embedding head module 18 moves down and cuts the end terminal of the antenna wires 11a-11n. Thereafter, the control unit 17 moves the embedding head module 18 to a starting point for a next process.

Further, the control unit 17 moves the second transfer coupling member 9 of the second transfer plate member 7 screw-coupled to the screw rod 5B formed on the center frame unit 10, as illustrated in FIG. 5B, moves the copper foil attaching module 33 coupled to the second transfer plate member 7 in the left and right direction, and moves the copper foil pneumatic cylinder 34 coupled to the upper portion of the copper foil attaching module 33 up and down. Thus, the bridge 13 which has been transferred at a predetermined position is adsorbed by the vacuum adsorption nozzle 32 positioned at the lower portion of the copper foil attaching module 33. Then, the bridge 13 is transferred on the antenna substrate sheet 2 mounted in the base frame unit 4 which moves in the back and forward direction under the copper foil attaching module 33. Thereafter, the bridge 13 is attached to the end terminal of the wires 11a-11n of the antenna substrate sheet 2 where the multiple wire embedding process is completed without crossover of the wires 11a-11n.

Figure 10F:
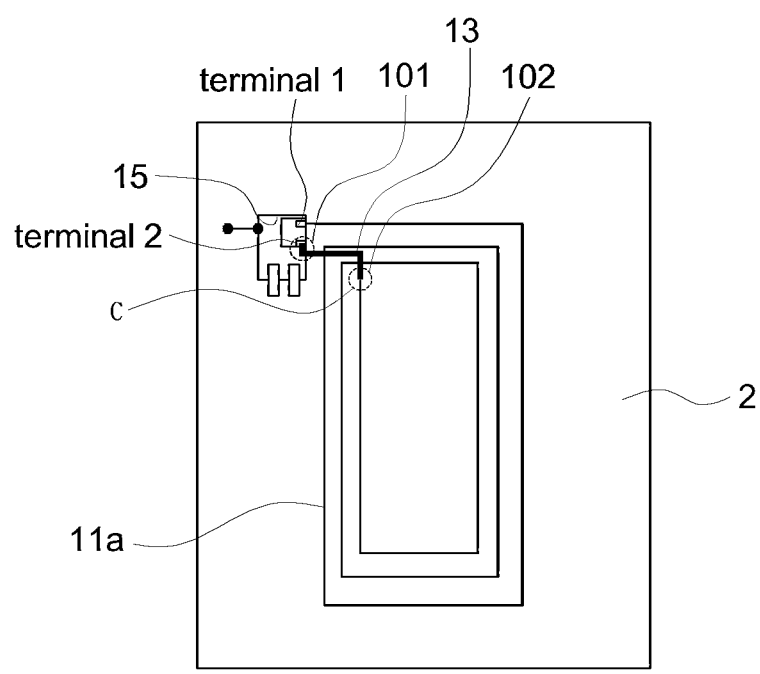
Figure 10G:
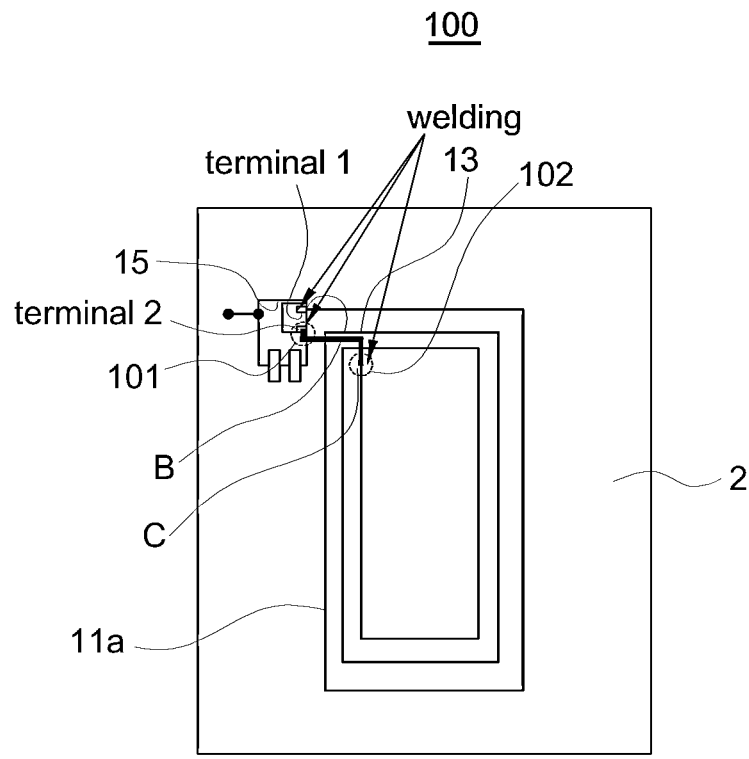

More particularly, the process of forming the bridge 13 includes forming the bridge 13 between point C and terminal 2 point of the connecting PCB 15, as illustrated in FIG. 10F by the copper foil attaching module 33. The thickness of the bridge may be about 10 to 40 μm and the size of the bridge 13 has a sufficient size not to lose current generated from the antenna.

The control unit 17 drives the welding module structure 16 to weld the connecting PCB 5, which is a connecting terminal of the antenna substrate sheet 2 where the bridge 13 has been formed. As a result, the wireless charging antenna 100 is formed. The control unit 17 moves the laser welding module 35 coupled to the second transfer plate member 7 in the left and right direction and moves the welding pneumatic cylinder 36 coupled to the upper end of the laser welding module 35 up and down by transferring the second transfer coupling member 9 of the second transfer plate member 7 screw-coupled to the screw rods 5A, 5B formed on the center frame unit 10. Then, the connecting PCB 5 positioned under the laser welding module 35, which is a connecting terminal of the antenna substrate sheet 2 where the bridge 13 has been formed, is welded to form the wireless charging antenna 100. As illustrated in FIG. 10G, the welding process welds terminal 1 (point B) and terminal 2 of the connecting PCB 15, and point C with a laser compression method to form the wireless charging antenna 100.

In an embodiment of the present disclosure, the punching process may use a punching mold (not shown) which fits a product standard at a completed antenna sheet.

The antenna device 100 manufactured by an embodiment of the present disclosure comprises the antenna substrate sheet 2 to which the connecting PCB 15 is attached and the antenna pattern which starts from one (terminal 1) of a plurality of connection terminals of the connecting PCB 15 and ends at another (terminal 2) of the plurality of connection terminals. The antenna pattern may comprise the plurality of wires 11a-11n which functions as one line embedded in the antenna substrate sheet 2 and the bridge 13, which connects terminal 2 of the connecting PCB and the point (e.g., point "C" in FIG. 10G) where the winding of the plurality of wires 11a-11n is completed on the antenna substrate sheet 2.

In an embodiment, the one or more openings 101, 102 may be formed through the antenna substrate sheet 2; at least one (terminal 2) of the plurality of terminals of the connecting PCB 15 may be positioned in the opening 101; and the bridge 13 may be located on the lower portion of the antenna substrate sheet 2.

In an embodiment, the starting point (B or terminal 1) of the wires 11a-11n and both end terminals (C and terminal 2) of the bridge 13 may be welded.

In an embodiment, one single longitudinal opening (not shown) instead of the circular openings 101, 102 may be formed. The connecting PCB 15 may be located on the lower portion of the antenna substrate sheet 2 and all terminals including terminals 1 and 2 of the connecting PCB 15 may be in the longitudinal opening. At this time, the bridge may be on the antenna substrate sheet 2.

In an embodiment, the process for forming the bridge 13 may be omitted. The antenna device (not shown) of this embodiment may comprise the antenna substrate sheet 2 to which the connecting PCB 15 is attached and the antenna pattern which starts from one (terminal 1) of a plurality of connection terminals of the connecting PCB 15 and ends at another (terminal 2) of the plurality of connection terminals. The antenna pattern may comprise the plurality of wires 11a-11n which functions as one line embedded in the antenna substrate sheet 2. The starting point of the wires 11a-11n is welded at a position of terminal 1 of the connecting PCB 15. A point where winding of the plurality of wires 11a-11n is completed on the antenna substrate sheet 2 is welded at a position of terminal 2 of the connecting PCB 15.

In an embodiment, a thickness of the antenna device where the plurality of wires is overlapped may be increased. However, the omission of the process for forming the bridge 13 may decrease production time and cost.

Although various embodiments are illustrated and described, the present invention is not limited to the described embodiments, and it is obvious to those skilled in the art that various modifications and variations can be made without departing from the spirit and scope of the present invention. Therefore, it is to be understood that the present invention may be embodied in many other specific forms without departing from the technical idea or essential characteristics thereof, and the embodiments are to be considered in all respects as illustrative and not restrictive.

The invention claimed is:

1. An antenna manufacturing apparatus comprising:
   a base frame on which an antenna substrate sheet is mounted;
   a center frame disposed on a center portion of the base frame;
   an embedding head structure coupled to the center frame and for embedding a plurality of wires on the antenna substrate sheet in parallel simultaneously;
   a welding module structure coupled to the center frame and for welding an antenna pattern including the plurality of wires to a connecting printed circuit board (PCB); and
   a copper foil attaching structure for forming a bridge for connecting an end terminal of the plurality of wires and the connecting PCB.

2. The antenna manufacturing apparatus of claim 1, wherein the bridge comprises a copper foil or a composite including at least the copper foil.

3. The antenna manufacturing apparatus of claim 1, wherein the embedding head structure comprises:
   an embedding head module for supplying the plurality of wires, and an ultrasonic vibration member coupled to the embedding head module and for generating a predetermined energy via ultrasonic vibration to melt the antenna substrate sheet.

4. The antenna manufacturing apparatus of claim 3, wherein the embedding head structure comprises:
   a plurality of wire spools at its upper end, each of the plurality of wire spools supplying each of the plurality of wires, and
   a wire supply rotation plate member being configured to be rotatable.

5. A wireless charging antenna device comprising:
   an antenna substrate sheet to which a connecting printed circuit board (PCB) is attached; and
   an antenna pattern embedded on the antenna substrate sheet, wherein the antenna pattern starts from one of a plurality of connecting terminals of the connecting PCB and ends at another one of the plurality of connecting terminals, wherein the antenna pattern comprises a plurality of wires which functions as one line, embedded in parallel simultaneously on the antenna substrate sheet, and a bridge for connecting the connecting PCB and a point where winding of the plurality of wires is completed on the antenna substrate sheet.

6. The wireless charging antenna device of claim 5,
wherein the bridge comprises a copper foil or a composite including at least the copper foil.

7. The wireless charging antenna device of claim 6,
wherein one or more openings are formed on the antenna substrate sheet and at least one of the plurality of connecting terminals of the connecting PCB is positioned in the one or more openings.

8. The wireless charging antenna device of claim 7,
wherein a starting end of the plurality of wires and both ends of the bridge are welded.

9. A wireless charging antenna device comprising:
an antenna substrate sheet to which a connecting printed circuit board (PCB) is attached; and
an antenna pattern embedded on the antenna substrate sheet, wherein the antenna pattern starts from one of a plurality of connecting terminals of the connecting PCB and ends at another one of the plurality of connecting terminals,
wherein the antenna pattern includes a plurality of wires which functions as one line, embedded in parallel simultaneously on the antenna substrate sheet,
wherein a starting end of the plurality of wires is welded at a position of terminal 1 of the connecting PCB and a point where winding of the plurality of wires on the antenna substrate sheet is completed is welded at a position of terminal 2 of the connecting PCB.

10. The wireless charging antenna device of claim 9,
wherein one or more openings are formed on the antenna substrate sheet and at least one of the plurality of connecting terminals of the connecting PCB is positioned in the one or more openings.

\* \* \* \* \*